United States Patent
Ma et al.

(10) Patent No.: US 7,329,856 B2
(45) Date of Patent: Feb. 12, 2008

(54) IMAGE SENSOR HAVING INTEGRATED INFRARED-FILTERING OPTICAL DEVICE AND RELATED METHOD

(75) Inventors: Guolin Ma, Milpitas, CA (US); Jason Hartlove, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/926,152

(22) Filed: Aug. 24, 2004

(65) Prior Publication Data

US 2006/0043260 A1   Mar. 2, 2006

(51) Int. Cl.
G01J 3/50 (2006.01)
H01J 27/14 (2006.01)
H01J 31/0232 (2006.01)

(52) U.S. Cl. .......... 250/226; 250/208.1; 250/216; 250/239; 257/432; 257/433; 257/436; 257/431; 359/350; 359/356; 359/361; 359/722; 359/885

(58) Field of Classification Search .......... 250/208.1, 250/216, 239, 226; 257/432–437; 359/350, 359/356, 361, 619–629, 722, 723, 885; 348/374
See application file for complete search history.

(56) References Cited

U.S. PATENT DOCUMENTS

| | | | |
|---|---|---|---|
| 5,600,172 A | 2/1997 | McDevitt et al. | |
| 6,115,187 A * | 9/2000 | Tabata et al. | 359/654 |
| 6,169,283 B1 | 1/2001 | Bawolek et al. | |
| 6,362,513 B2 | 3/2002 | Wester | |
| 6,577,339 B1 * | 6/2003 | Thompson et al. | 348/211.14 |
| 6,577,342 B1 | 6/2003 | Wester | |
| 6,623,666 B1 | 9/2003 | Bawolek et al. | |
| 6,683,298 B1 | 1/2004 | Hunter et al. | |
| 6,727,431 B2 * | 4/2004 | Hashimoto | 174/539 |
| 6,744,109 B2 * | 6/2004 | Barton et al. | 257/436 |
| 6,884,985 B2 * | 4/2005 | Raynor | 250/208.1 |
| 6,940,141 B2 * | 9/2005 | Kinsman | 257/433 |
| 6,956,272 B2 * | 10/2005 | Chapman | 257/433 |
| 7,084,472 B2 * | 8/2006 | Fukuyoshi et al. | 257/432 |
| 2001/0048064 A1 * | 12/2001 | Kitani | 250/208.1 |
| 2002/0089596 A1 | 7/2002 | Suda | |
| 2003/0025825 A1 * | 2/2003 | Nakajoh | 348/374 |
| 2005/0061950 A1 * | 3/2005 | Jiang et al. | 250/208.1 |
| 2005/0189601 A1 * | 9/2005 | Sugiyama | 257/432 |
| 2005/0236684 A1 * | 10/2005 | Chen et al. | 257/433 |

FOREIGN PATENT DOCUMENTS

| | | |
|---|---|---|
| CA | 2 462 945 | 1/2004 |
| EP | 1 067 779 A2 | 1/2001 |
| JP | 2004200360 | 7/2004 |
| KR | 1020040059770 | 7/2004 |

* cited by examiner

*Primary Examiner*—Davienne Monbleau
(74) *Attorney, Agent, or Firm*—RatnerPrestia

(57) ABSTRACT

An image sensing device is disclosed having a die formed with an array of photosensing sites and a structure of optical material having infrared absorbing characteristics formed over the photosensing sites. An embodiment is disclosed in which the structure of optical material having infrared absorbing characteristics is formed as an array of microlenses for directing visible image light onto the photosensing sites and at the same time filtering out infrared wavelengths that interfere with image capture. Alternatively, the structure may be designed to filter out other ranges of wavelengths outside of the visible spectrum.

17 Claims, 8 Drawing Sheets

IMAGE SENSOR HAVING INTEGRATED INFRARED-FILTERING OPTICAL DEVICE AND RELATED METHOD

FIELD OF THE INVENTION

The invention relates to imaging systems and more particularly to filtering of selected wavelengths, such as infrared energy, from light imaged onto sensor devices in an integrated electrical optical device.

BACKGROUND OF THE INVENTION

Image sensing devices that capture monochrome or color images by changes in the electrical properties of photosensing pixels on integrated circuit dies or chips have provided an alternative to traditional film technology. Known types of the sensors include field effect transistor (FET) or diode devices, fabricated with complementary metal oxide semiconductor (CMOS) or charge couple device (CCD) technology.

CMOS and CCD image sensors each have advantages and disadvantages. CMOS technology offers ease of interfacing with other CMOS based hardware and can reduce power drain on portable devices such as digital cameras, video phones, PDAs and other appliances and especially battery powered units. CCD equipment is an older technology and is in many cases more easily fabricated with high pixel densities. Both of these and other sensors typically require blocking of infrared (IR) light energy from the imaging light that contains the desired visible image. Also, it may be desirable to filter out ultra violet (UV) energy from the imaging light.

This is because the most common semiconductor-based image sensing devices such as the above are silicon-based and respond not only to visible light (approximately 380 to 780 nanometers), but also to infrared light in the range of approximately 780 to 1100 nanometers. Quality color capture without a blocking filter for these wavelengths is virtually impossible because the IR typically swamps the sensor performance and thereby corrupts the output levels. Similarly monochrome capture relies on preserving the luminance in the sensed visible light, which is difficult without IR filtering.

There are two types of common IR filters, which filter out energy in the infrared region of the electromagnetic spectrum. The first kind is blue colored glass such as made by ionic coloration. Such colored glass is relatively expensive, approximately 20 times more expensive than clear glass. Another type of filter element uses a clear piece of glass that has a thin film coating on one surface to cause cancellation by interference of those incoming wavelengths such as IR that are outside the visible spectrum. This type of filter uses multilayer thin-film stacks with designed thicknesses, usually in the nanometer (nm)range, to pass and reflect a selected wavelength. To filter IR, the cutoff wavelength is approximately 630 nm, with transmission dropping to approximately 50% at 650 nm, and dropping to a few percent at 680 nm. One problem with this approach, however, is that the thin film coating is usually optimized for particular wavelengths and for light rays normal to the thin film surface. Therefore, the infrared light rays near the edges of the pixel array, which usually exit the field lens at an angle, are less effectively filtered. This edge effect usually shifts the 50% transmission wavelength from 650 nm to less than 630 nm, thus shifting the color of the imaged light toward the red part of the spectrum. This may cause a visual artifact at the edges of the image known as a color discontinuity. In some cases, image processing can be used to remove the color shift, but at added cost and complexity.

While effort has been made to provide IR and UV blocking without sacrificing the image integrity or adding excessive cost and complexity to the image sensing optics, the approaches thus far fall short in one or more respects. For example, certain digital imaging systems incorporate a separate filter, typically glass or plastic, as part of the optical train, i.e., somewhere in the optical system either in front of or between the field lens and the sensor package. The field lens or fieldlens assembly is usually separated from the sensor by air or other fill gas and this open chamber may be sealed off in a package, sometimes called a shell case. Mounting of the filter in the case chamber may result in dust and other contaminants lodging on the sensor pixels and obstructing the image rays. Another known approach places an IR filter element over or at a window of the sensor package above the sensor die.

Such a placement is shown by way of example in FIGS. 1A and 1B marked prior art, where a package or case 15 contains an image sensor die 17. A window on the case is covered by a filter element 25, which may be made of coated glass or a plastic material containing a dye for absorbing IR wavelengths.

The separate selective IR and/or UV filter element 25 adds an additional component to the total system count, i.e., piece-part count, and adds to the complexity and manufacturing cost of the imaging system. Further, depending on where the selective filter 25 is placed, there may be an increase in the system size that diversely affects cost of performance. Moreover, often the separate filter is either thin film coated on or made by doped glass and then cut into small pieces and mounted. The resulting dust and particles from these operations may contaminate the camera sensor and block active sensor pixels.

Sensor pixels that receive the filtered light are shown for example on a prior-art sensor die 17' and a microlens 30 in FIG. 1B. The die 17' is one of many identical dies that are typically manufactured simultaneously in a semiconductor wafer. The dies are often formed layer by layer, and result in a grid or array of photodetecting sites 20. Other integrated circuit elements (not shown), such as transistors, which cooperate with the photodetecting sites provide an image signal as well known in this technology. The photodetecting elements and the other circuit elements are interconnected using one or more metal layers (not shown). Color filter material (not shown) may be then deposited into wells across the entire wafer, usually above a passivation layer (not shown). This material is repeatedly deposited and patterned so that several different color filters are disposed to direct light of a specific color onto a receptive sensor element. To improve the efficiency with which photosensing sites 20 respond to incident light, a microlens structure 30 is attached to or formed on die 17' and focuses the incident light onto photodetecting sites 20.

Sensor chip or die 17' may be made using CMOS or CCD technology. For many years, CCDs have dominated the market in terms of speed, sensitivity, reliability, packaging and price. However CMOS devices offer the advantages noted above and effort is being made in CMOS technology to meet or exceed all critical price and performance characteristics of CCDs, and to deliver advantages to product developers that CCDs do not offer. One design factor in this effort is to use an array format incorporating the microlens structure described above. As CMOS based sensors compete with CCD devices, the provision of microlens arrays over the photosensing sites becomes important. Microlenses allow the use of smaller transistor sites which in turn afford increased sensor density and improved fill factor.

The microlens structure 30, being an array of hemispherical, cylindrical, or other shaped lens elements, is often made from an optically clear polymer resin material such as a durable acrylic that is molded or cast into the shape of the desired lens array and adhesively attached to the sensor die. In other fabrications the resin is spun onto the entire wafer and processed by photoresist and etching into the microlens shapes. The resulting microlens layer may have a thickness of 1-3 μm for example. Suitable materials for a microlens structure include those materials such as acrylic plastics and thermally or UV-light curable epoxy that have high transmissivity (greater than 90 percent) across the visible spectrum of light (380-780 nm), and are resistant to aging effects (e.g., oxidation, decomposition), environmental effects (e.g., moisture uptake, heat resistance), and physical effects (e.g., stress, deformation).

But as discussed above, a problem with the above-described imaging system is that the IR filter element 25 may increase the size and part count, and thus the cost, of the system, and may introduce contamination that reduces the performance of the system. Furthermore, where the filter element 25 is coated with a thin film, the filter element may introduce a color discontinuity into the captured image.

SUMMARY OF THE INVENTION

An image sensing device is disclosed having a die formed with an array of photosensing sites and a structure of optical material that absorbs light energy outside the visible spectrum and is disposed over the photosensing sites. An embodiment of the invention is disclosed in which the structure is an optical material having infrared absorbing characteristics and is formed in the shape of an array of microlenses for directing visible image light onto the photosensing sites while at the same time filtering out infrared.

DESCRIPTION OF THE INVENTION

One embodiment of the invention is to use a dye that absorbs light energy of a wavelength lying outside the visible spectrum, such as IR, and mixing such dye into a plastic that is then formed into an optical structure disposed on the sensor. Absorptive dye often performs better than a thin film coating because filtration of the unwanted light typically occurs regardless of the angle of incidence of incoming light, and also because the IR absorption by the dye typically does not cause a color shift around the edges of the image. In a particular embodiment of the invention as disclosed herein the IR absorptive material is mixed in with a polymer resin. During a heated fluid state, the mixture is formed into the sensor microlens. The microlens structure made of dye and polymer resin overlies the photosensing sites and both filters out unwanted wavelengths, such as IR, and focuses the desired visible light onto the sites. By providing the selective filtration and lens focus with the same optical structure, the manufacturing process, product size and part count, are typically enhanced, and the cost is typically reduced.

The microlens is, for example, formed by a fill process in a mold to make it into the proper shape over the image sensor die. By merely adding in the IR absorptive material into the raw polymer before forming the microlens, one effectively integrates the IR filter with the microlens for little or no additional complexity in the microlens formation process. Furthermore, this saves costs because the glass or other separate filter is no longer needed. This also reduces the complexity of the assembly. This is particularly evident where the image sensor includes a package that seals the microlens along with the integrated circuit die in a chamber that contains the pixel array. Furthermore, since this packaging occurs in a clean room already, it may eliminate the potential of dust entering the chamber during manufacturing since now a separate IR filter does not need to be introduced into the chamber. Furthermore, because absorptive dye is used, light from any angle can be filtered and color shift around the image edges typically does not occur.

Figure 1A:
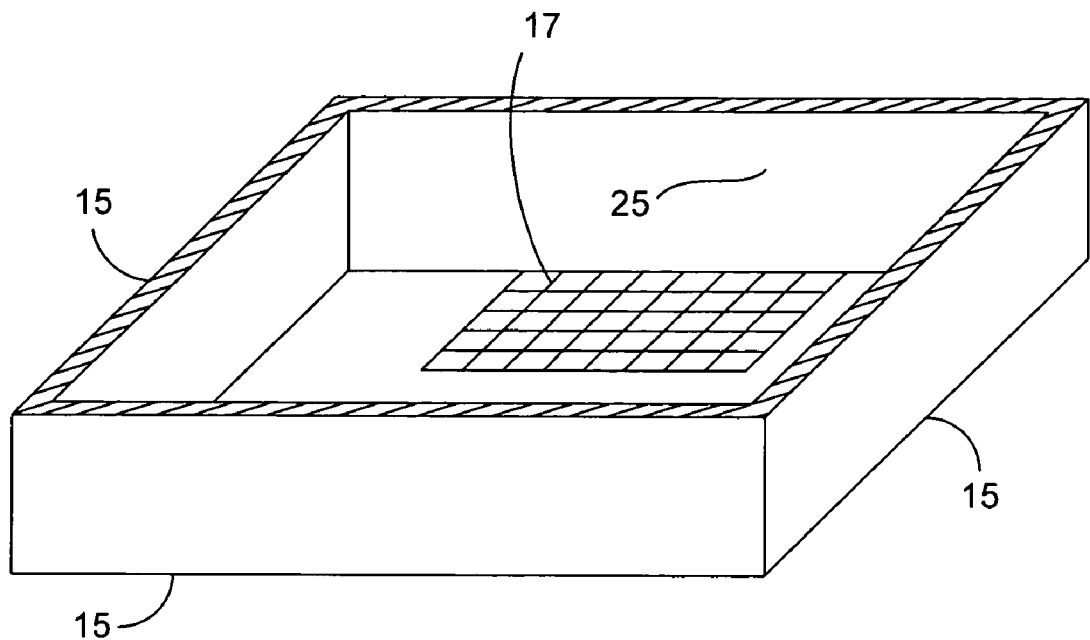
FIG. 1A is an isometric illustration of an image sensing device in accordance with a prior art design.
Figure 1B:
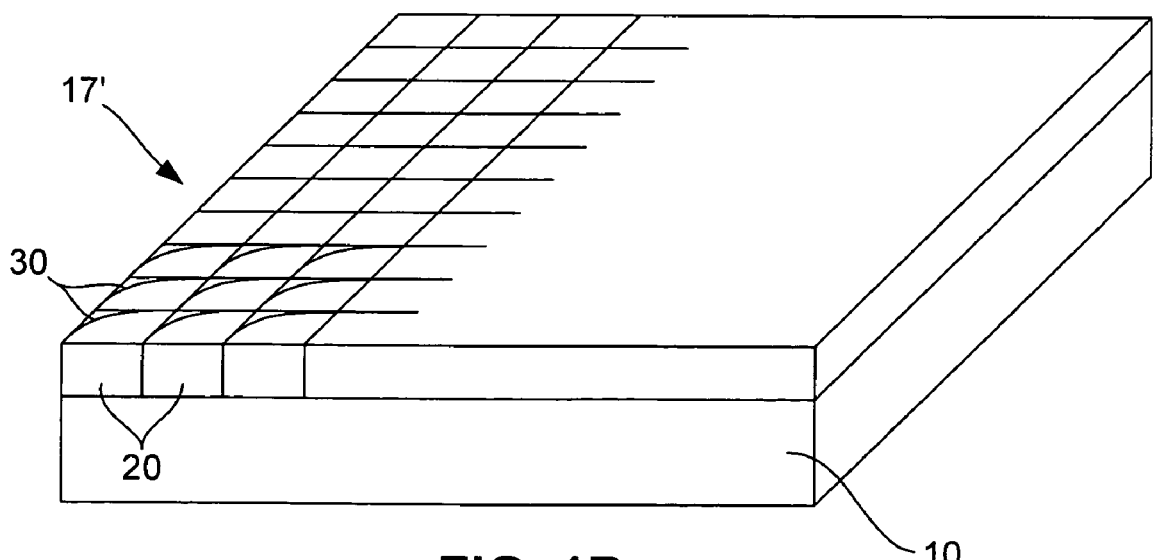
FIG. 1B is an isometric illustration of a sensor die including a microlens array in accordance with a prior art design.
Figure 2:
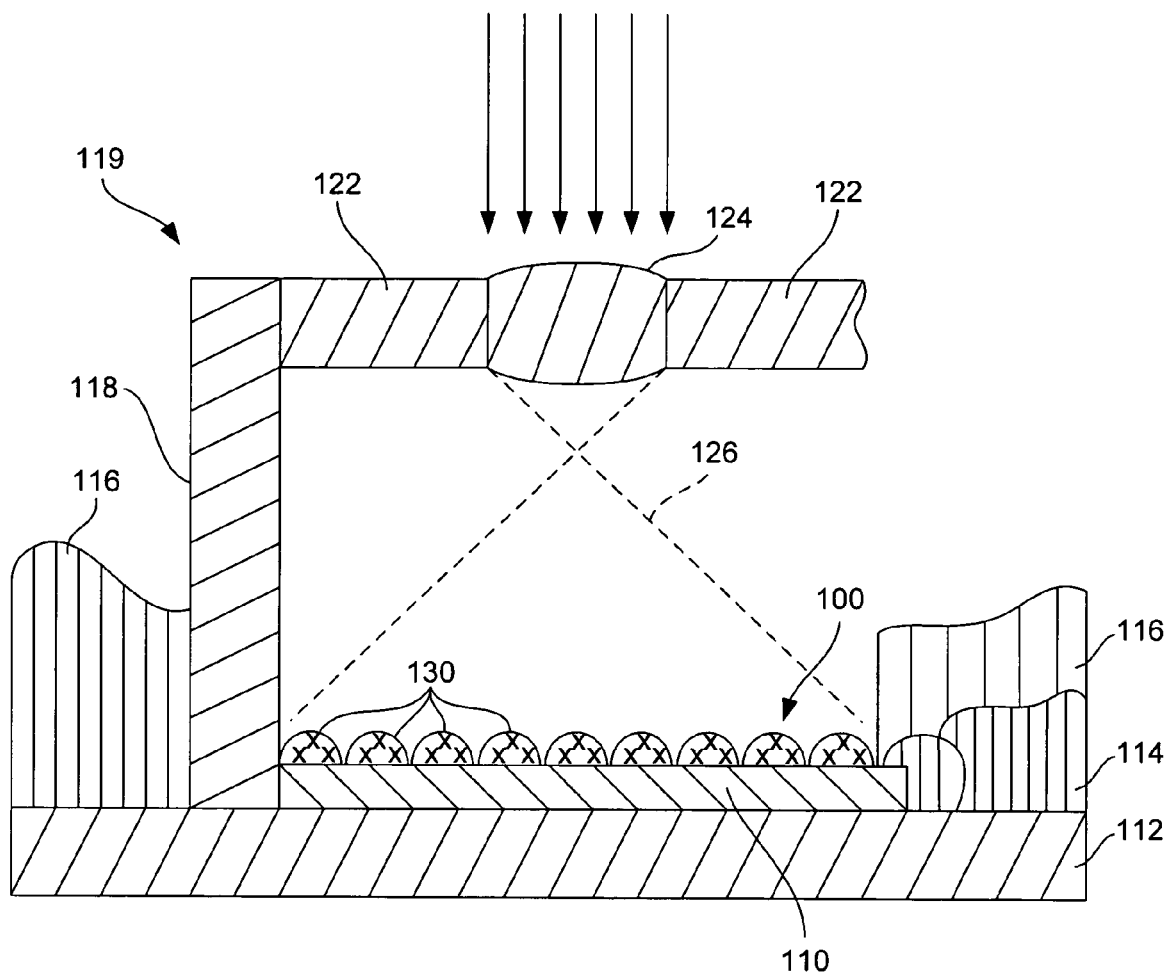
FIG. 2 is a planar side view partly cut away for clarity showing an embodiment of the image sensing device in accordance with the invention.

FIG. 2 shows an embodiment of the invention in which an image-sensor die 100 having a structure of arrayed microlenses 130 on a die substrate 110 is mounted to a circuit board 112. Die 100 is fabricated, layer by layer, to incorporate on the substrate 110 photosensing sites 120 (see FIG. 3A) and other integrated circuitry as known in this technology. The microlenses 130 are molded from the mixture of polymer resin and IR absorbing dye, such as by a process of injection fill using heat fluidity of the microlens material. The molding process may, for example, form the IR filter and lens material on a surface of the substrate 110 as shown, so that the lenses of the array are affixed in optical registration with corresponding pixel sites 120. Alternatively, the microlenses may be separately molded, cast, or micromachined and then affixed by adhesive to die 100. Still another process may be used, forming the microlenes 130 on the die 100 by sequential depositing and pattern etching of the plastic using known lens fabricating techniques.

Metal pads or metal layers (not shown) on the die 100 are wire bonded, such as shown at 114, to the circuit board 112 in a known assembly procedure to make electrical connection to the integrated circuitry of the die 110. An adhesive organic resin in the form of glob 116, sometimes called "globtop" secures the die 100 to the circuit board 112 in known manner. To maintain alignment between the microlenses 130 and a field lens 124, a side wall 118 of a field lens holder 119 is also held in place by resin adhesive globs 116. A holder shroud 122 such as made of plastic or other suitably rigid material supports the field lens 124 in optical registration with the die 100. An optical path indicated by a dotted-line path 126 images an object onto the surface of the die 100 and the arrayed microlenses 130. The field-lens holder 119 may be an enclosed housing that seals the space between the lens 124 and the microlenses 130 so as to protect the die 100 from dust.

Figure 3A:
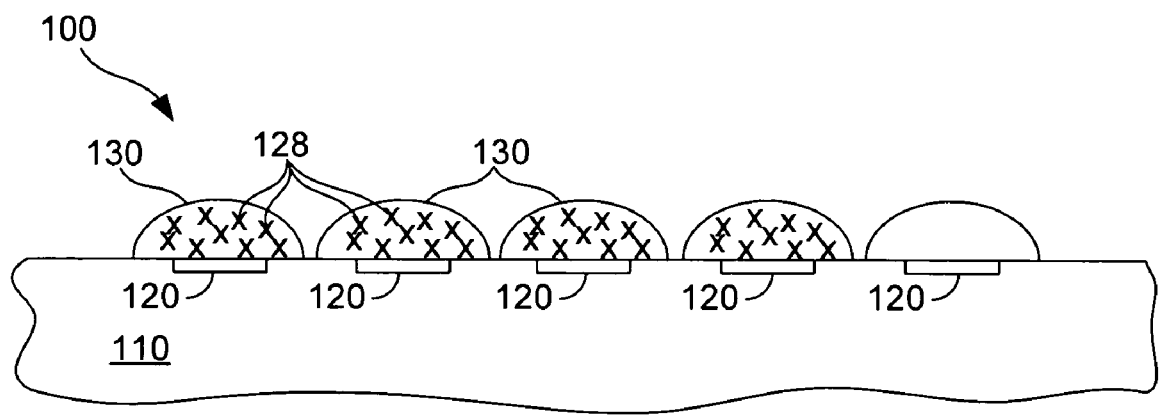
FIG. 3A is a fragmentary side view, in skematic, of a portion, greatly enlarged, of the array of microlenses and the array of electrical sensors of a die contained in the device of FIG. 2 according to an embodiment of the invention.
Figure 3B:
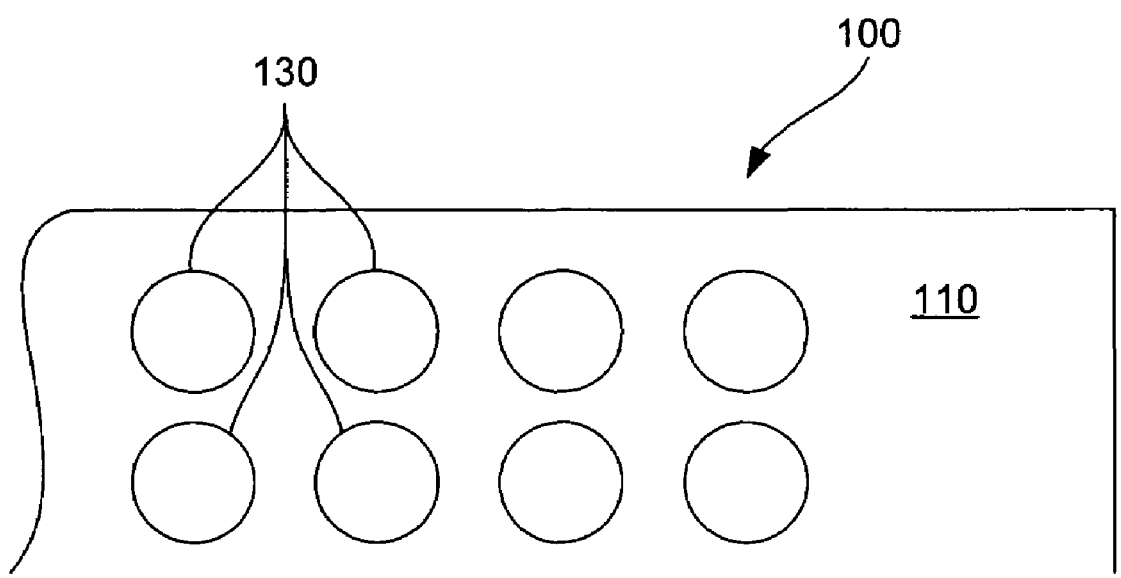
FIG. 3B is a fragmentary top view of the array of microlenses of FIG. 3A according to an embodiment of the invention.

FIGS. 3A and 3B show in enlarged cross-section and top plan views that the microlenses 130 of the array are in an x-y array as are the photosensing sites 120 according to an embodiment of the invention. Image light from the field lens 124 is filtered by the dye in the plastic microlenses 130, thus absorbing the IR, and the shapes of the microlenses redirect image light rays in the visible spectrum so as to be focused onto the respective sensing sites 120.

More particularly, the photosensing sites 120 and the microlenses 130 are arranged in a two-dimensional array with each such site corresponding to a sensing pixel. Such sites 120 can be made out of p- and n-doped regions in material such as bulk silicon or amorphous silicon, or depletion regions under polysilicon or metal gates. These sites 120 behave as a capacitor when given an electrical charge, but discharge electrons with photon impingement. The rate of discharge increases proportionally to the intensity of incident light. Circuitry (not shown), for example CMOS gates, among and around the photosensitive sites 120 measure the change in charge over a known period of time for each pixel, and generate signals representing an image formed on the surface of image-sensor substrate 110.

The microlenses 130 redirect light from a wider field of view onto the respective underlying photosensitive sites 120. In one configuration, each microlens 130 corresponds to a single photosensing pixel site 120 and has a hemispherical or generally convex shape that focuses light on to the corresponding site 120. Other microlens configurations are contemplated such as forming the microlens with the IR absorbing dye into a half cylinder (i.e., in the general shape of a large airplane hanger) overlying a row or column of photosensitive sites 120. The half-cylinder shape focuses the filtered light onto the row or column of the sensing sites 120.

As described above, the mixed dye and polymer resin is deposited and UV cured, or is injection molded in a known fill process, to form the microlenses 130 on the substrate 110. Other lens-forming processes may be used. One technique for forming the array of microlenses 130 begins by coating the substrate 110 with a layer of a transparent photoresist. The photoresist is then patterned to form small regions corresponding to the microlenses 130. After patterning, heating liquefies the photoresist, and the surface tension of the liquefied photoresist causes each region to take on a convex shape that remains when the photoresist solidifies. Beneath the microlenses 130, color-filter layer patterns are then formed on the substrate 110 in a known manner in the light path leading to the sites 120 so as to capture color content in the visible light spectrum.

Figure 4:
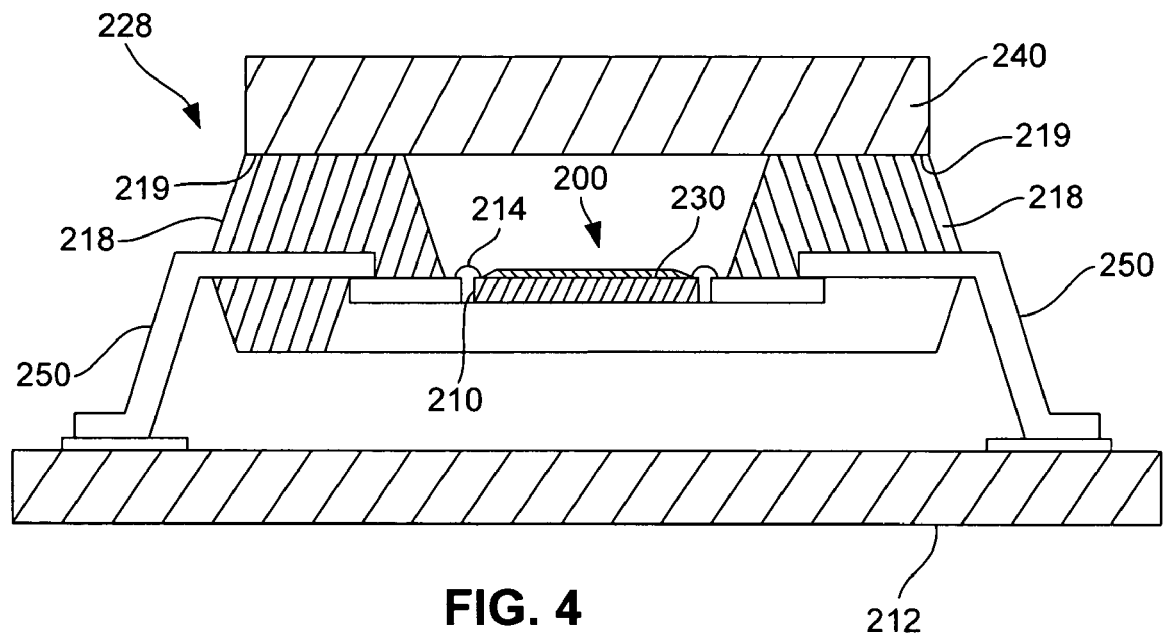
FIG. 4 is a sectional side view of another embodiment of the image sensing device in accordance with the invention.

Another embodiment in accordance with the invention is shown in FIG. 4 to include a glass plate 240 or other transparent cover attached to a side wall 218 of a shell case sensor package 228 that surrounds a die 200 and the array of infrared absorbing microlenses 230 thereon. The package side wall 218 is of a suitably durable material such as plastic or ceramic sized to provide separation between the lower face of the plate 240 and the upper convex surfaces of the microlenses 230. A glass top plate 240 is bonded to the upper extents 219 of the wall 218 by a sealant adhesive and protects the microlenses 230. Connections 250 to the pads on a circuit board 212 mount and electrically connect the sensor to external circuitry. A field-lens assembly, when used, is mounted by suitable supporting structure (not shown) to the board 212 so as to be in optical path alignment with the sensor package and the sensor die 200.

Figure 5:
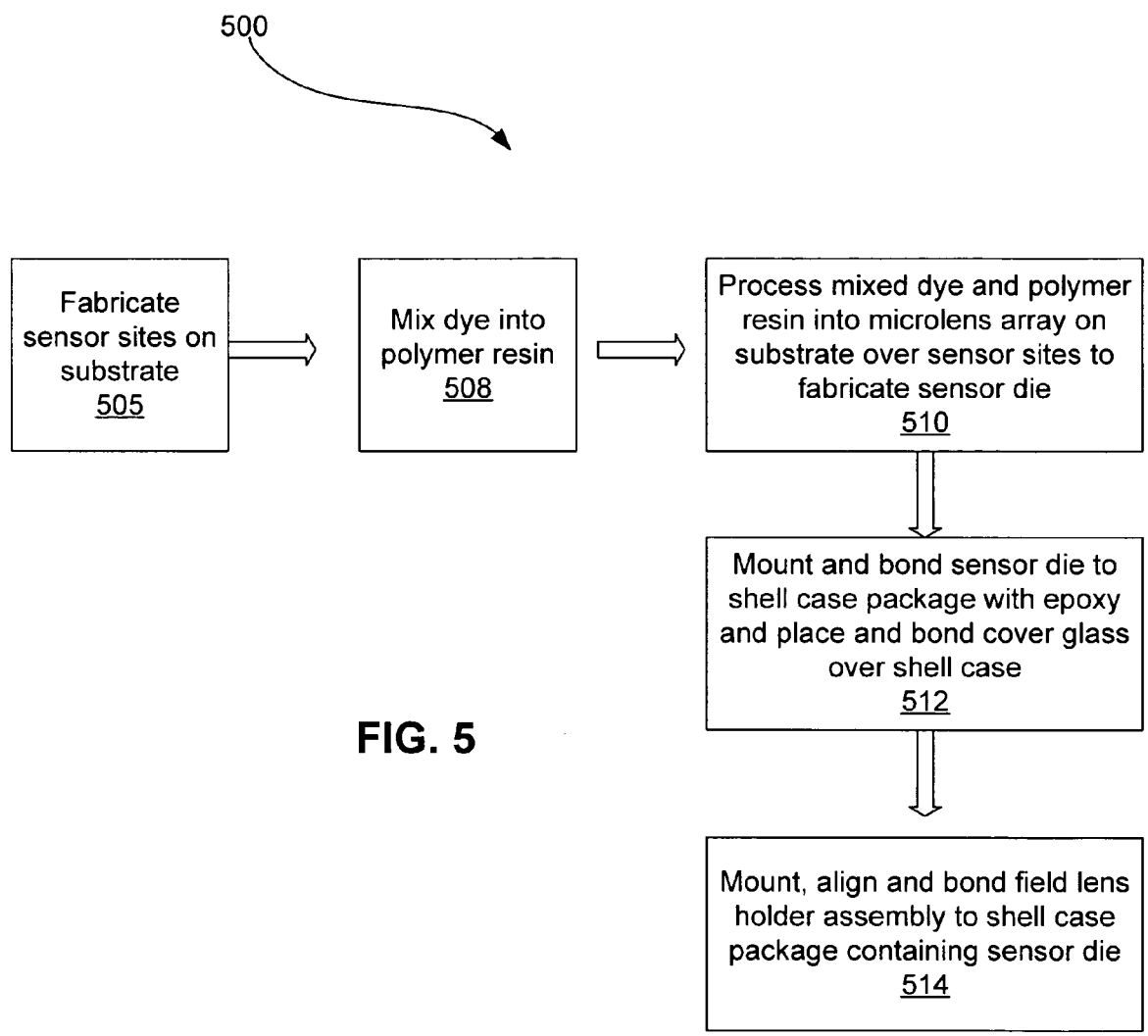
FIG. 5 is a flow chart illustrating an embodiment of the fabricating process for making the embodiment of the image-sensing device of FIG. 4.

FIG. 5 is a flow diagram of a fabrication process 500 for an image sensor in accordance with an embodiment of the invention. In process 500, an initial step 505 uses conventional CMOS integrated circuit manufacturing techniques to form electrical components of image sensor in and on a wafer of silicon. Usually a number of sensor chips or dies are formed on a wafer and then later cut into separate dies each to constitute a separate image sensor. In step 508 selective dyes are mixed into the polymer resin in powder form in accordance with known recipes to absorb and hence block or filter out as much the IR wavelengths or other non-visible light energy as desired. Then the mixed dye and resin are processed by heating or UV curing and known fabrication processes in step 510 to form an array of microlenses on the image sensor substrate. These lens arrays can be formed using conventional techniques such as injection molding or casting. Alternatively, the microlens arrays may be formed by sequential layering and etching using patterned photoresist, etching chemicals and applied heat to produce convex optical shapes at each pixel site. In step 512 the completed die with the integrated circuit substrate and microlens array is mounted and bonded in a shell case and the transparent glass protective cover is adhesively secured in place on the top opening of the case. At step 514 the field lens or lens assembly (more than one lens may be used depending on the application) is aligned and mounted to the shell case or other supporting structure in optical alignment with the field of microlenses of the sensor die. In this fabrication sequence the microlenses that also serve as the IR blocking filter are formed in a clean room environment and the placement of the cover seals the package to reduce the chance of contaminating dust particles lodging on the microlens pixels during assembly of the camera or other application product.

Alternatively, the microlenses formed on the die substrate may be of other known types such as gradient index lenses made by altering the refractive index as a function of lens depth. In such case, the IR-absorbing characteristics are obtained by preparing the lens base material with various known IR absorption ingredients along with fabrication steps that introduce the gradient change of the refractive index.

In forming the lens array from a plastic or polymer resin, there are various known methods of making the finished structure selective to IR light, including dispersing the dye throughout a plastic material or casting or coating the dye in or on the plastic material. Suitable plastic materials that may serve this purpose include, but are not limited to, polymethyl methacrylate, polycarbonates, or polystyrene. A suitable resin material is a metal-based epoxy. The IR-selective dyes may include, but are not limited to, dithiolene and phenyldiamine nickel complex types.

Figure 6:
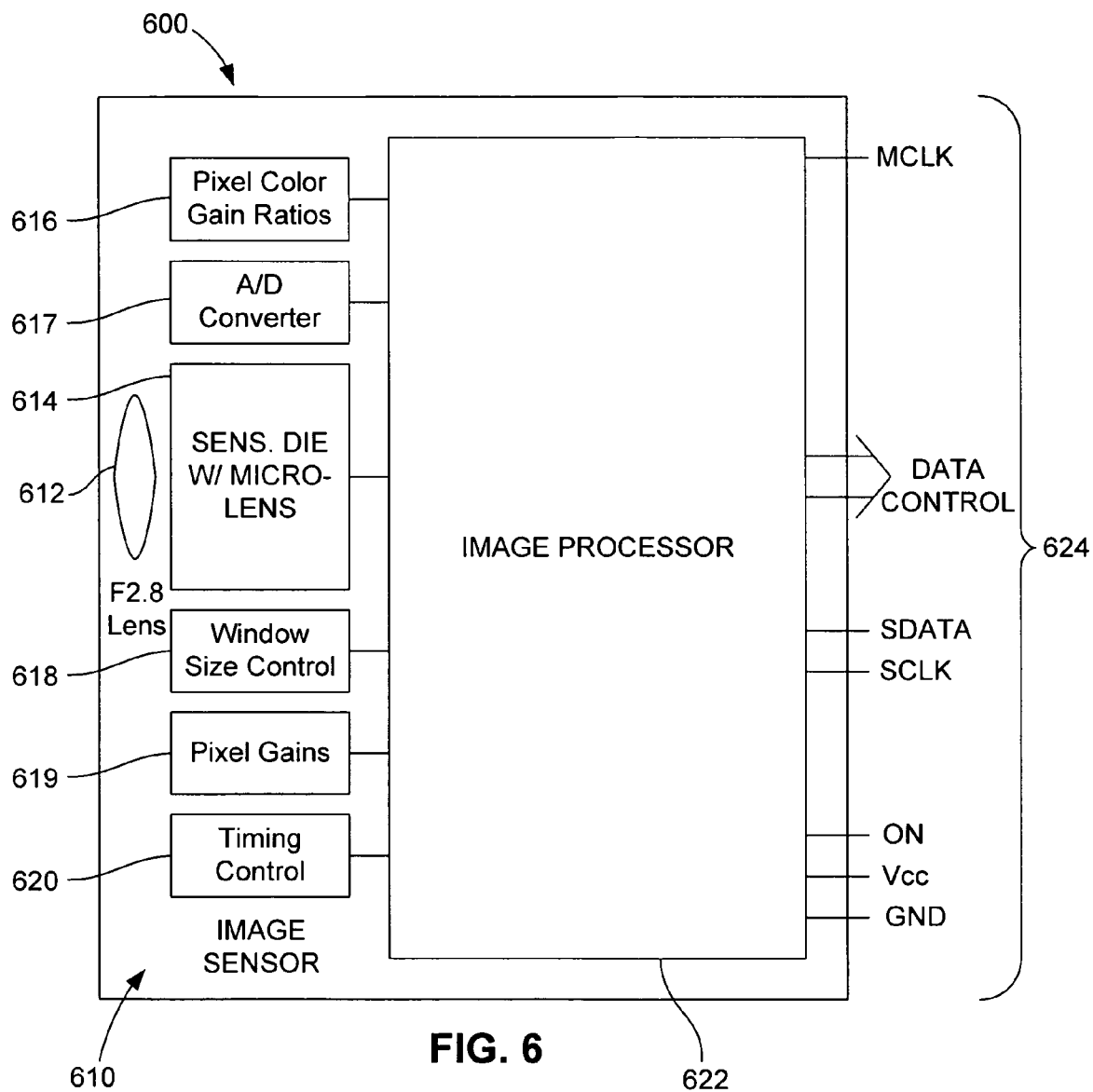
FIG. 6 is a block diagram of an imaging system that incorporates either or both of the image-sensing device of FIGS. 2-3A and 4 in accordance with an embodiment of the invention.

Referring to FIG. 6, the image-sensing devices of FIGS. 2-4 and their alternatives described above may be used as part of a digital imaging system 600. The imaging system 600 has an image sensor 610, such as provided by the sensors 100 and 200 described above, for receiving imaging light that has infrared energy from a field lens 612. Integrated into the sensor 610 is the sensor die and pixel microlens array 614 for absorbing the IR and focusing the remaining visible light onto the photosensors. For example, the microlenses 130 or 230 described above may constitute the array 614. The sensor 610 has also various circuitry integrated therewith including here: a pixel color-gain ratio function 616, A/D converter 617, window-size control 618, pixel gains function 619, and timing control 620. An image processor 622 having known circuitry and operation is connected to the sensor 610 and has the various control and data lines 624 for controlling the circuitry and receiving an electrical print of the sensed image. Since such circuitry and signal processing are known in this technology, they are not described further. Part or all of the processor 622 may be integrated into the same die that includes the sensor 610.

Figure 7:
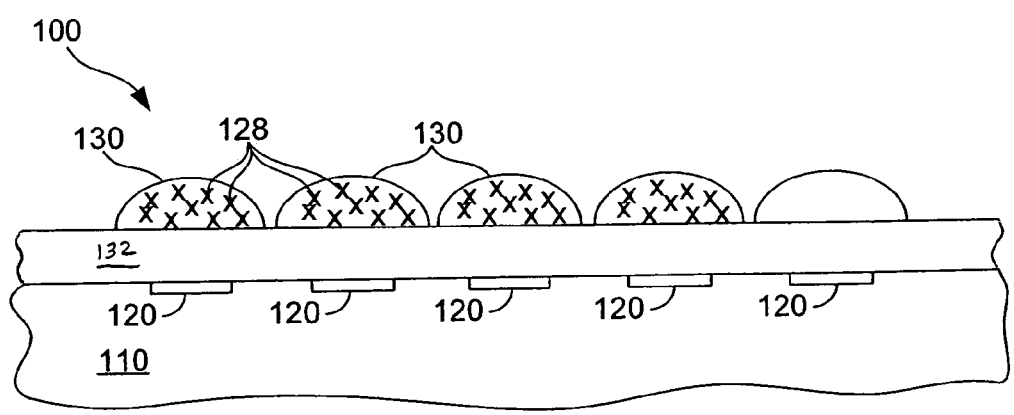
FIG. 7 is a fragmentary side view of a portion of an array of microlenses contained in an image sensing device according to another embodiment of the invention.

In the preceding detailed description, the invention is described with reference to specific embodiments. It will, however, be evident that various modifications and changes may be made thereto without departing from the broader spirit and scope of the invention as set forth in the claims. The specification and drawings are, accordingly, to be regarded in an illustrative rather than a restrictive sense. Although the invention has been described with reference to particular embodiments, the description is only an example of the invention's application and should not be taken as a limitation. For example, although the above embodiments employ CMOS image sensors, other devices employing microlens arrays can also benefit from embodiments of the invention that provide IR (or other electromagnetic energy) blockage in the microlens array on the sensor die. Furthermore, although the microlenses are shown disposed directly on the substrate, there may be other layers 132 between the microlenses 130 and the substrate 110 as shown in FIG. 7, and one or more of these layers can include IR absorbing dye in addition to or in place of the IR absorbing dye in the microlenses. Additionally, although there are descriptions of some specific materials and particular structures, such descriptions merely provide suitable examples and are not intended as a limitation. Various other adaptations and combinations of features of the embodiments disclosed are within the scope of the invention.

What is claimed is:

1. An imaging device, comprising:
   a substrate having photosensing elements;
   a light-transmissive optical structure of microlenses on the substrate to direct light onto the photosensing elements;
   wherein each microlens is a hemispherical or cylindrical shaped lens element and a mixture of polymer resin and a material that absorbs infrared energy from the light, and
   the mixture forming each microlens is disposed as a single layer directly on and in contact with the substrate having the photosensing elements.

2. The imaging device of claim 1 wherein the optical structure of microlenses comprises an array.

3. The imaging device of claim 1 wherein the optical structure of microlenses comprises a plastic material formed into an array.

4. The imaging device of claim 3 wherein the plastic material comprises a dye that absorbs infrared energy.

5. The imaging device of claim 1 wherein the optical structure of microlenses comprises a plastic resin.

6. The imaging device of claim 5 wherein the optical structure of microlenses comprises a layer of plastic resin formed on the substrate into an array.

7. The imaging device of claim 1 wherein the photosensing elements include CMOS devices.

8. The imaging device of claim 1 wherein the optical structure of microlenses comprises a plastic substance formed on the substrate to direct light energy onto the photosensing elements, and
   the plastic substance has a dye that selectively absorbs infrared energy.

9. An imaging device comprising:
   a substrate including integrated electrical elements;
   an array of lenses on the substrate;
   a shell structure surrounding the array of lenses and having a top opening;
   a light-transmissive cover attached to the top opening of the shell structure; and
   inside each lens is a substance that is substantially transmissive of visible light and substantially absorbent of selected wavelengths of light outside the visible spectrum;
   wherein the array of lenses have hemispherical or cylindrical shaped lens elements and is formed from a mixture of a polymer and a dye for absorbing the selected wavelengths of light outside the visible spectrum, and
   the mixture forming the array of lenses is disposed as a single layer directly on and in contact with the substrate.

10. The imaging device of claim 9 wherein the cover comprises glass.

11. The imaging device of claim 9 wherein the array of lenses comprises a plastic resin mixed with a dye that absorbs energy in the infrared band.

12. The imaging device of claim 9, further comprising a field lens mounted in spaced relation to the cover for directing image light onto the array of lenses.

13. The imaging device of claim 12 wherein the field lens comprises glass.

14. The imaging device of claim 9 wherein the electrical elements include CMOS devices.

15. The imaging device of claim 9, further comprising an adhesive sealant attaching the cover to the shell structure to protect the array of lenses and substrate.

16. The imaging device of claim 9 wherein the array of lenses comprises microlenses formed on the substrate so as to focus light energy onto certain of the electrical elements.

17. The imaging device of claim 9, further comprising color filters operable to cause the electrical elements to capture color content of an image.

* * * * *